United States Patent
Ueda

(10) Patent No.: US 10,151,024 B2
(45) Date of Patent: Dec. 11, 2018

(54) METHOD FOR PRODUCING TRANSPARENT CONDUCTIVE FILM

(71) Applicant: KANEKA CORPORATION, Osaka-shi, Osaka (JP)

(72) Inventor: Hiroaki Ueda, Otsu (JP)

(73) Assignee: KANEKA CORPORATION, Osaka-Shi, Osaka (JP)

( * ) Notice: Subject to any disclaimer, the term of this patent is extended or adjusted under 35 U.S.C. 154(b) by 169 days.

(21) Appl. No.: 15/126,267

(22) PCT Filed: Feb. 27, 2015

(86) PCT No.: PCT/JP2015/055973
§ 371 (c)(1),
(2) Date: Sep. 14, 2016

(87) PCT Pub. No.: WO2015/151687
PCT Pub. Date: Oct. 8, 2015

(65) Prior Publication Data
US 2017/0088938 A1  Mar. 30, 2017

(30) Foreign Application Priority Data
Mar. 31, 2014 (JP) .................................. 2014-074531

(51) Int. Cl.
*C23C 14/34* (2006.01)
*C23C 14/08* (2006.01)
(Continued)

(52) U.S. Cl.
CPC ........ *C23C 14/3492* (2013.01); *C23C 14/086* (2013.01); *C23C 14/562* (2013.01); *C23C 14/568* (2013.01); *C23C 14/5806* (2013.01)

(58) Field of Classification Search
CPC . C23C 14/086; C23C 14/3492; C23C 14/562; C23C 14/5806; C23C 14/568
(Continued)

(56) References Cited

U.S. PATENT DOCUMENTS

2003/0035906 A1* 2/2003 Memarian ........... C23C 14/0036
428/1.3
2011/0177314 A1 7/2011 Tatami et al.
(Continued)

FOREIGN PATENT DOCUMENTS

JP 2003313651 A 11/2003
JP 2004339602 A 12/2004
(Continued)

OTHER PUBLICATIONS

International Bureau of WIPO, International Preliminary Report on Patentability Issued in Application No. PCT/JP2015/055973, dated Oct. 13, 2016, WIPO, 5 pages.
ISA Japan Patent Office, International Search Report Issued in Application No. PCT/JP2015/055973, dated May 26, 2015, WIPO, 2 pages.

Primary Examiner — Rodney G McDonald
(74) Attorney, Agent, or Firm — Alleman Hall Creasman & Tuttle LLP

(57) ABSTRACT

For use in a method for producing a transparent conductive film having an ITO transparent electrode layer, a roll-to-roll sputtering apparatus includes at least three deposition chambers adjacent to a deposition roll. While a transparent film substrate is conveyed on the deposition roll, a base conductive layer is formed by sputtering deposition in one or more deposition chambers, and a main conductive layer is formed thereon by successive sputtering deposition in two or more film deposition chambers. The applied power in the deposition chambers where the underlying conductive layer is formed is 5% to 20% of the total of the applied power in each the deposition chamber where the underlying or main (Continued)

conductive layer is formed. In formation of the main conductive layer, the applied power in the deposition chamber where the ITO thin film is first deposited is less than the applied power in the next deposition chamber.

6 Claims, 2 Drawing Sheets

(51) Int. Cl.
 *C23C 14/56* (2006.01)
 *C23C 14/58* (2006.01)
(58) Field of Classification Search
 USPC .................................................. 204/192.29
 See application file for complete search history.

(56) References Cited

U.S. PATENT DOCUMENTS

| | | |
|---|---|---|
| 2012/0111718 A1 | 5/2012 | Haishi et al. |
| 2012/0114923 A1 | 5/2012 | Haishi et al. |
| 2014/0370275 A1 | 12/2014 | Kuchiyama et al. |

FOREIGN PATENT DOCUMENTS

| | | |
|---|---|---|
| JP | 2010282785 A | 12/2010 |
| JP | 2012112031 A | 6/2012 |
| JP | 2013129868 A | 7/2013 |
| WO | 2013081106 A1 | 6/2013 |
| WO | 2013111681 A1 | 8/2013 |
| WO | 2013115125 A1 | 8/2013 |

* cited by examiner

METHOD FOR PRODUCING TRANSPARENT CONDUCTIVE FILM

TECHNICAL FIELD

The invention relates to a method for producing transparent conductive film in which a transparent electrode layer is provided on a transparent film.

BACKGROUND ART

Transparent conductive films in which a transparent electrode layer formed of a conductive oxide such as indium-tin composite oxide (ITO) is formed on a transparent film substrate are widely used for touch panel position detection etc. For improvement of transparency, reduction of resistance, suppression of a change in resistance value, and so on, crystallized conductive oxides are used in transparent electrodes.

Generally, a roll-to-roll sputtering apparatus is used for production of a transparent conductive film. In production of a transparent conductive film, it is necessary to deposit a transparent electrode layer to the extent that the film has heat resistance. Accordingly, the deposition temperature (substrate temperature) is generally 200° C. or lower, and the transparent electrode layer immediately after the deposition by roll-to-roll sputtering is an amorphous film. The amorphous transparent electrode layer is crystallized when heated under an oxygen atmosphere.

It is known that in production of a transparent conductive film by roll-to-roll sputtering, an outgas from a substrate film during sputtering deposition influences the film quality and crystallization behavior of a transparent electrode layer. For example, Patent Document 1 discloses that when a first thin-film is deposited with a low power density, and a film is then deposited thereon at a high rate with a high power density, damage to a substrate film can be minimized, and generation of an outgas from the substrate can be suppressed. Patent Document 2 discloses that when a film substrate is heated before deposition, or a dielectric layer of silicon oxide or the like is provided on a film substrate, the amount of an outgas resulting from plasma damage etc. during sputtering deposition can be reduced to control the crystallinity of a transparent electrode layer.

Patent Document 3 discloses that uniformity of crystal grain size in the transparent electrode layer is enhanced when a cleaning (bombardment) of the surface of a film substrate is performed before deposition of a transparent electrode layer by generating plasma in the presence of an inert gas such as an argon gas. Specifically, organic components are volatilized from the film substrate by bombardment, and therefore the partial pressure of a gas with a mass number of 28 in an atmosphere during deposition of the transparent electrode layer is reduced, so that crystal grains in the transparent electrode layer can be made uniform.

Patent Document 4 discloses that when a transparent electrode layer has a stacked configuration of two or more layers, both reduction of the resistance of the transparent electrode layer and short-time crystallization of the transparent electrode layer can be achieved. Specifically, an ITO layer having a low tin oxide content is provided on the transparent conductive film surface side (side away from the film substrate) to accelerate formation of crystal nuclei, and an ITO layer having a high tin oxide content is provided on the film substrate side to increase carriers, so that short-time crystallization and reduction of the resistance can be achieved. Further, Patent Document 4 describes that it is preferable to evacuate the inside of a sputtering apparatus to a water partial pressure of $1 \times 10^{-4}$ Pa or less before the start of deposition, so that deposition is performed in an atmosphere cleared of impurities such as an outgas from the film substrate.

Patent Document 5 discloses that when a dielectric layer of silicon oxide or the like is provided on a substrate film, a transparent electrode layer is sputtering-deposited thereon at a low oxygen partial pressure, the transparent electrode layer can be crystallized even by low-temperature and short-time heating (or at room temperature). Patent Document 5 describes an estimation principle in which low-temperature and short-time crystallization can be performed by increasing oxygen deficiency in the conductive oxide. Patent Document 5 also describes that the dielectric layer of silicon oxide or the like acts as an underlying layer for film growth, and also acts as a gas barrier layer which reduces plasma damage to the substrate film during deposition of the transparent electrode layer, so that an oxygen gas generated from the substrate is inhibited from being captured in the film, leading to an increase in oxygen deficiency in the film, and thus crystallization can be performed at a low temperature in a short time.

PRIOR ART DOCUMENTS

Patent Documents

Patent Document 1: JP-A 2004-339602
Patent Document 2: WO 2013/115125
Patent Document 3: JP-A 2010-282785
Patent Document 4: JP-A 2012-112031
Patent Document 5: WO 2013/111681

SUMMARY OF THE INVENTION

Problems to be Solved by the Invention

In recent years, for improvement of position detection accuracy and improvement of a response speed in capacitance touch panels, demand is increasing for transparent conductive films including a transparent electrode layer having lower resistance. At the same time, for improvement of productivity, a transparent electrode layer which can be crystalized by shorter-time heating is required. The present inventors have performed bombardment before deposition of a transparent electrode layer as disclosed in Patent Document 3, but an effect of reducing the resistant of the transparent electrode layer or reduction of the crystallization time has been not obtained.

For extremely reducing the water partial pressure in a sputtering apparatus to $1.0 \times 10^{-4}$ Pa or less before the start of deposition as disclosed in Patent Document 4, long-time vacuum evacuation is required, leading to an increase in deposition apparatus occupation time, which is a time taken until completion of deposition after introduction of a film substrate into a deposition chamber. Accordingly, even though the crystallization time after deposition is reduced, productivity in total production from the start of deposition to crystallization is hardly improved.

A method in which a transparent electrode layer is sputtering-deposited on a dielectric layer of silicon oxide or the like as disclosed in Patent Document 5 is effective for reduction of the crystallization time because activation energy for crystallization is reduced, so that crystallization can be performed at room temperature. However, silicon oxide is easily degraded by light irradiation, so that a reduction in transmittance, and external appearance defects such as discoloration may occur.

In view of these situations, an object of the present invention is to provide a transparent conductive film including an ITO film which can be crystallized in a short time without using an underlying layer of silicon oxide or the like having an influence on visibility and which has low resistance after crystallization.

Means for Solving the Problems

The inventors have conducted studies in view of the situations described above, and resultantly found that the above-mentioned object can be achieved by the method in which an underlying conductive layer having a small thickness is sputtering-deposited in the initial stage of deposition of a transparent electrode layer, and a main conductive layer constituting a main thickness part is sputtering-deposited thereon, wherein the applied power (deposition power) during deposition of each of these layers is adjusted.

The present invention relates to a method for producing a transparent conductive film using a roll-to-roll sputtering apparatus, wherein the transparent conductive film includes a transparent film substrate, and a transparent electrode layer on the transparent film substrate. The roll-to-roll sputtering apparatus to be used in the production method of the present invention includes at least three deposition chambers adjacent to a deposition roll.

In the production method of the present invention, a transparent electrode layer is deposited while a transparent film substrate is unwound from a transparent film substrate wound body and conveyed on a deposition roll in a roll-to-roll sputtering apparatus. Deposition of the transparent electrode layer includes an underlying conductive layer formation step in which an underlying conductive layer formed of an indium-tin composite oxide (ITO) thin-film and having a thickness of 0.5 nm to 4 nm is formed by sputtering deposition in one or more deposition chambers; and a main conductive layer formation step in which a main conductive layer including an ITO thin-film and having a total thickness of 8 nm to 25 nm is formed on the underlying conductive layer by sequential sputtering deposition in two or more deposition chambers. The applied power in the deposition chamber where the underlying conductive layer is formed is 5% to 20% of the total applied power in each the deposition chamber where the underlying conductive layer or the main conductive layer is formed.

In the production method of the present invention, as compared to the applied power in the deposition chamber where the ITO thin-film is first deposited, the applied power in the deposition chamber where the ITO thin-film is subsequently deposited is larger in the main conductive layer formation step.

Further, the partial pressure of a gas with a mass-to-charge ratio of 28, which is measured by a quadrupole mass spectrometer in the deposition chamber where the underlying conductive layer is formed is 75% or more of the total partial pressure of a gas with a mass-to-charge ratio of 28, which is measured by a quadrupole mass spectrometer in each the deposition chamber where the underlying conductive layer or the main conductive layer is formed.

The main conductive layer may include on a substrate-side main conductive layer a surface-side main conductive layer having a lower tin oxide content based on the total of indium oxide and tin oxide as compared to the substrate-side main conductive layer. In this case, in the main conductive layer formation step, the substrate-side main conductive layer is sputtering-deposited in two or more deposition chambers, and the surface-side main conductive layer is sputtering-deposited thereon.

In the underlying conductive layer, the content of tin oxide based on the total of indium oxide and tin oxide is preferably 8% by weight or less. In the main conductive layer, the content of tin oxide based on the total of indium oxide and tin oxide is preferably 6% by weight to 15% by weight. The content of tin oxide based on the total of indium oxide and tin oxide in the main conductive layer is preferably higher than the content of tin oxide based on the total of indium oxide and tin oxide in the underlying conductive layer.

In the production method of the present invention, it is preferable that the transparent film substrate unwound from the wound body is heat-treated before being conveyed onto the deposition roll. The heat treatment is performed by, for example, bringing the transparent film substrate into contact with a heating roll.

Effects of the Invention

In the production method of the present invention, an underlying conductive layer is deposited with an applied power that is 5 to 20% of an applied power for depositing the whole of a transparent electrode layer, and thus a carbon atom-containing gas and a nitrogen atom-containing gas (gas with a mass-to-charge ratio of 28, which is measured by a quadrupole mass spectrometer) is released from the substrate into an underlying conductive layer deposition atmosphere (deposition chamber). A main conductive layer is deposited after the gas is released from the substrate, and therefore the gas partial pressure of each of the carbon atom-containing gas and the nitrogen atom-containing gas in a main conductive layer deposition environment becomes relatively low. Accordingly, the film quality of the main conductive layer which constitutes a main part of the film quality of the transparent electrode layer is improved, and a transparent electrode layer which is capable of being crystallized in a short time and has low resistance after crystallization can be formed.

MODE FOR CARRYING OUT THE INVENTION

[Configuration of Transparent Conductive Film]

Figure 1:
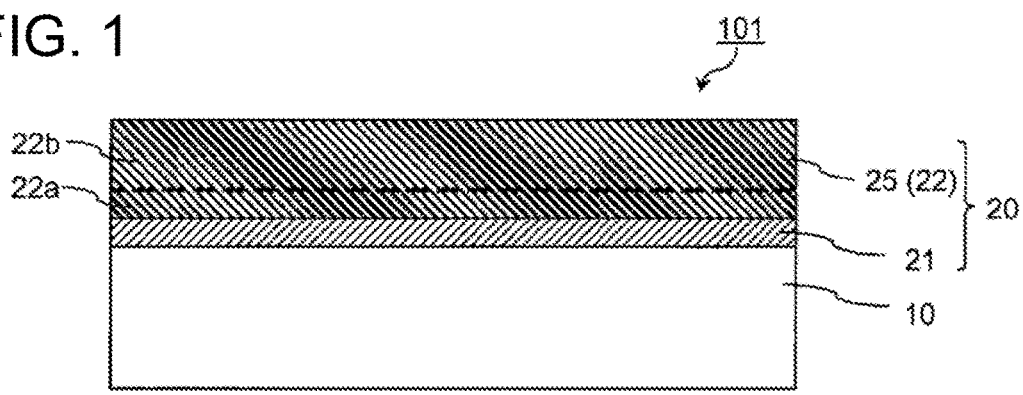
FIG. 1 is a schematic sectional view of a transparent conductive film according to one embodiment.

Hereinafter, a preferred embodiment of the present invention will be described with reference to the drawings. FIG. 1 shows a transparent conductive film 101 including a transparent electrode layer 20 on a transparent film substrate 10. The transparent electrode layer 20 includes an underlying conductive layer 21 on the transparent film substrate 10 side, and a main conductive layer 25 on the surface side. As in a transparent conductive film 102 shown in FIG. 2, the main conductive layer 25 may have a stacked configuration in which a surface-side main conductive layer 23 is provided on a substrate-side main conductive layer 22, with the former conductive layer having a composition different from that of the latter conductive layer.

<Transparent Film Substrate>

The transparent film substrate 10 is preferably colorless and transparent in a visible light region. Examples of the material of the transparent film substrate include polyester-based resins such as polyethylene terephthalate (PET), polybutylene terephthalate (PBT) and polyethylene naphthalate (PEN), cydoolefin-based resins, polycarbonate resins, polyimide resins and cellulose-based resins. Among them, polyester-based resins are preferable, and polyethylene terephthalate is particularly preferably used.

Although the thickness of the transparent film substrate is not particularly limited, it is preferably 10 µm to 400 µm, more preferably 25 µm to 200 µm. When the thickness is in the above-mentioned range, the transparent film substrate may have durability and moderate flexibility. Therefore the transparent electrode layer 20 can be deposited on the transparent film substrate with high productivity by a roll-to-roll method with using a roll-to-roll sputtering apparatus.

The transparent film substrate may have a functional layer (not illustrated) such as a hard coat layer or an easily adhesive layer on one or both of the surfaces thereof. The transparent film substrate may have an optical adjustment layer (not illustrated) on a transparent electrode layer-formed surface side for improving visibility by, for example, reduction of the reflectance and adjustment of the color phase. The optical adjustment layer may be a stack of a plurality of layers having different refractive indexes. For improvement of adhesion, etc., the transparent film substrate may be subjected to a surface treatment such as a plasma treatment, corona discharge, flaming, irradiation of ultraviolet rays, irradiation of electron beams or roughening.

Preferably, the optical adjustment layer is colorless and transparent in a visible light region, and has a resistivity of 10 Ω·cm or more. As a material of the optical adjustment layer, either an organic material or an inorganic material may be used. As the organic material, an acryl-based resin, a fluorine-based resin, a urethane-based resin, a melamine-based resin, an alkyd-based resin, a siloxane-based polymer or the like is used. As the inorganic material, an oxide of a metal such as Nb, Ta, Ti, Zn, Zr or Hf is suitably used. An organic-inorganic hybrid material may be used from the viewpoint of adjustment of the refractive index. The optical adjustment layer can be formed by dry processes such as a vapor deposition method, a sputtering method and a CVD method, various kinds of wet methods, and so on. The thickness of the optical adjustment layer is not particularly limited, and is appropriately set within the range of, for example, not more than 200 nm according to the above-mentioned purpose with consideration given to the refractive index of the material.

<Transparent Electrode Layer>

The transparent electrode layer 20 is a stack of the underlying conductive layer 21 on the transparent film substrate 10 side and the main conductive layer 25 on the surface side, and each of the underlying conductive layer 21 and the main conductive layer 25 is an indium-tin composite oxide (ITO) thin-film (the underlying conductive layer 21 may be an indium oxide thin-film which does not contain tin oxide). The thickness of the underlying conductive layer 21 is 0.5 nm to 4 nm, and the thickness of the main conductive layer 25 is 8 nm to 25 nm. In the present invention, the main conductive layer 25 constituting a main part of the thickness of the transparent electrode layer 20 is formed on an underlying conductive layer having a small thickness.

[Method for Producing Transparent Conductive Film]

Figure 3:
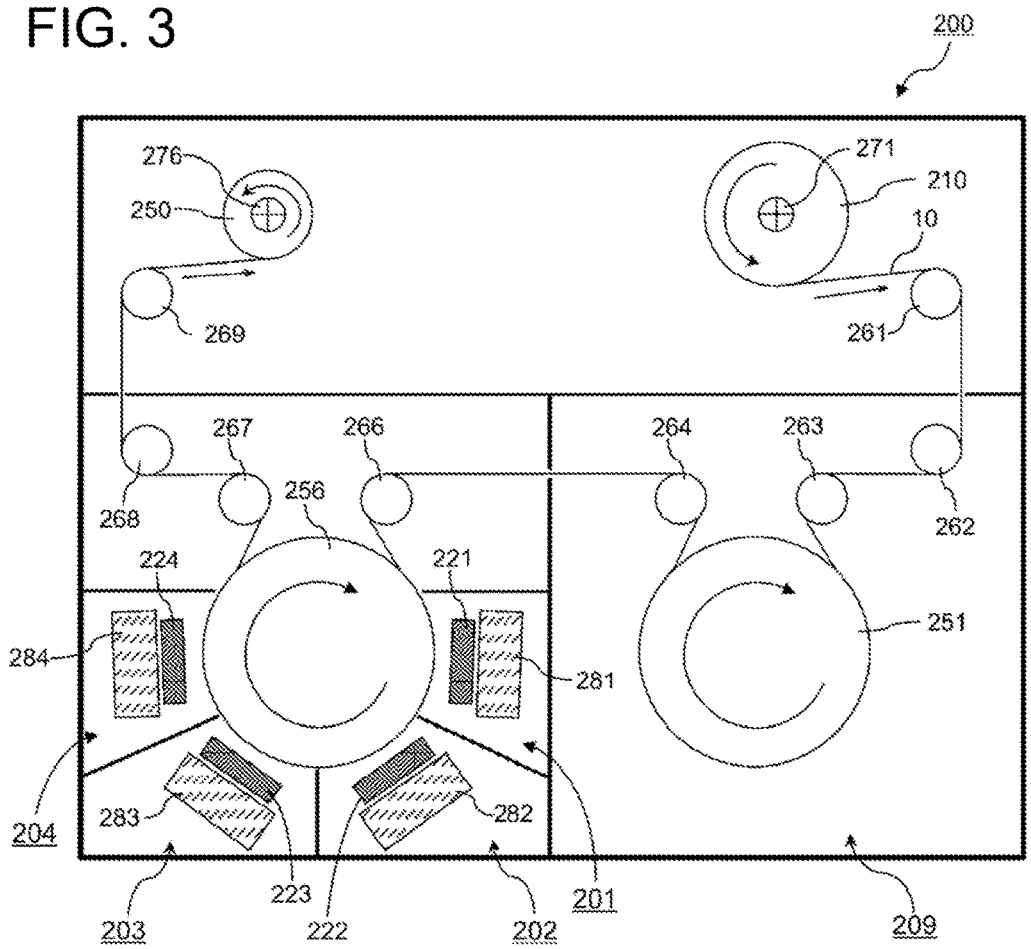
FIG. 3 is a schematic sectional view of an example of a configuration of a roll-to-roll sputtering apparatus.

In the production method of the present invention, the transparent electrode layer 20 is formed on the transparent film substrate 10 using a roll-to-roll sputtering apparatus including three or more deposition chambers. FIG. 3 is a schematic sectional view of an example of a configuration of a roll-to-roll sputtering apparatus including a heating chamber 209, and four deposition chambers 201, 202, 203 and 204. The deposition chambers and the heating chamber are separated from one another by a partition wall. A heating roll 251 is provided in the heating chamber 209. In the deposition chamber, a deposition roll 256 is provided adjacently to the partition between the chambers. Carrying rolls 261 to 269 are disposed between an unwinding roll 271 and the heating roll 251, between the heating roll 251 and the deposition roll 256 and between the deposition roll 256 and a winding roll 276. In deposition by roll-to-roll sputtering, the transparent film substrate 10 is continuously unwound from the unwinding roll 271, the film substrate is heated in the heating chamber 209, the amorphous ITO transparent electrode layer 20 is then sputtering-deposited in the deposition chambers 201 to 204, and the transparent conductive film is wound around the winding roll 276.

<Heat Treatment>

Preferably, the transparent film substrate 10 unwound from the unwinding roll 271 is subjected to a heat treatment before deposition of the transparent electrode layer 20. By the heat treatment, moisture etc. in the transparent film substrate can be volatilized to reduce the amount of volatile components such as moisture which are carried into the deposition chamber.

Figure 2:
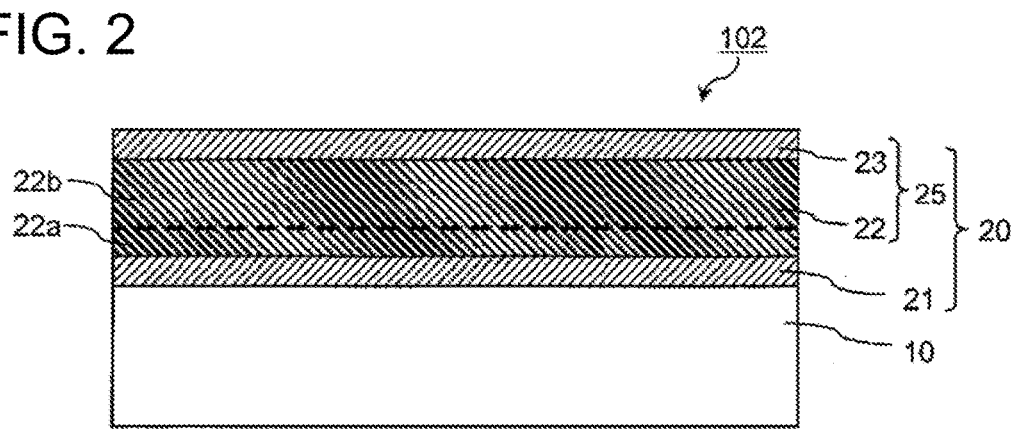
FIG. 2 is a schematic sectional view of a transparent conductive film according to one embodiment.

As the heat treatment method, a method in which a film substrate is brought into contact with a heating medium such as a heating roll, or a non-contact heating method using a temperature control means such as a heater or a heat pipe using microwaves, far-infrared rays or the like, or a hot air blowing nozzle can be used. Among them, a method in which a transparent film substrate is heated by contact with the heating roll 251 as shown in FIG. 2 is preferable from the viewpoint of securing the heating time, and heating efficiency. Contact-type heating means such as a heating roll may be used in combination with non-contact-type heating means.

Preferably, the heating temperature is set in such a manner that the surface temperature of the transparent film substrate is 70° C. to 160° C. For example, when the transparent film substrate is subjected to a heat treatment by contact with a heating roll, the temperature of the heating roll is preferably 80° C. to 150° C., more preferably 85° C. to 130° C., further preferably 90° C. to 110° C. The surface temperature of the film during the heat treatment is more preferably 80° C. to 150° C., further preferably 90° C. to 130° C. When the heating temperature is 70° C. or higher, moisture etc. in the film substrate can be volatilized to reduce the amount of moisture which is carried into the deposition chamber. When the heating temperature is 160° C. or lower, failures such as external appearance defects resulting from thermal shrinkage of the film can be suppressed. The heating time (contact time between the heating roll and the transparent film) is preferably 5 seconds to 180 seconds, more preferably 10 seconds to 120 seconds, further preferably 15 seconds to 60 seconds.

It is preferable that in the heat treatment step, the inside of the heating chamber is decompressed and evacuated for accelerating removal of moisture in the film substrate. The pressure in the heating chamber is preferably $1 \times 10^{-2}$ Pa or less, more preferably $7.0 \times 10^{-3}$ Pa or less, further preferably $5.0 \times 10^{-3}$ Pa or less.

<Deposition Step>

The transparent film substrate 10 unwound from the unwinding roll 271 is subjected to a heat treatment as necessary, and then conveyed along the deposition roll 256 while the transparent electrode layer 20 is deposited on the transparent film substrate 10. Preferably, deposition of the transparent electrode layer 20 is continuously performed without taking the heated transparent film substrate 10 out of a sputtering deposition apparatus 200.

As a sputtering power source during deposition of the transparent electrode layer, a DC, RF or MF power source or the like may be used. Cathodes 281 to 284 are provided in the vicinity of the deposition roll 256 in the deposition chambers 201 to 204, and targets 221 to 224 are disposed between the cathodes 281 to 284 and the deposition roll 256. For deposition of the ITO transparent electrode layer, a mixed sintered target of indium oxide and tin oxide is preferably used. The targets disposed in the deposition chambers may have the same or different compositions. When the sputtering deposition apparatus includes four or more deposition chambers, sputtering deposition may be performed in three or more deposition chambers, and it is not necessarily required to perform deposition in all the deposition chambers in the sputtering apparatus. It is not required to dispose a target in a deposition chamber where deposition is not performed.

It is preferable that before the start of deposition of the transparent electrode layer, pre-sputtering is performed for removing impurities on the target surface by evacuation. The pressure in the deposition chamber during pre-sputtering is preferably equivalent to the pressure during deposition of the transparent electrode layer, or lower than the pressure during deposition of the transparent electrode layer. Conditions such as a power density during pre-sputtering and a pre-sputtering time are appropriately set within the bounds of not impairing productivity.

Deposition of the transparent electrode layer is performed while a carrier gas containing an inert gas such as argon and an oxygen gas is introduced into the deposition chambers. The introduced gas is preferably a mixed gas of argon and oxygen. The pressure (total pressure) in each deposition chamber is preferably 1.5 Pa or less, more preferably 0.05 Pa to 1.2 Pa, further preferably 0.1 Pa to 0.9 Pa. The mixed gas may contain other gas as long as the feature of the present invention is not impaired.

The substrate temperature (temperature of the deposition roll 256) during deposition of the transparent electrode layer may be in a range of temperatures at which the transparent film substrate exhibits heat resistance. The substrate temperature is preferably −40° C. to 80° C., more preferably 10° C. to 60° C. When the substrate temperature is in a range as described above, occurrence of creases on the film substrate due to plasma damage etc. can be suppressed.

In the production method of the present invention, three or more deposition chambers are used for deposition of the transparent electrode layer. First, the underlying conductive layer 21 having a thickness of 0.5 nm to 4 nm is sputtering-deposited in a deposition chamber on the upstream side (side close to the unwinding roll 271), and the main conductive layer 25 having a thickness of 8 nm to 25 nm is deposited on the underlying conductive layer in a deposition chamber on the downstream side.

Two or more deposition chambers are used for formation of the main conductive layer. For example, when two deposition chambers are used for formation of the main conductive layer, a conductive layer 22a is sputtering-deposited on and in contact with the underlying conductive layer 21 in the deposition chamber on the upstream side, and a conductive layer 22b is then sputtering-deposited in the deposition chamber on the downstream side. Targets having the same composition are used for deposition of the conductive layer 22a and the conductive layer 22b. When three or more deposition chambers are used for formation of the main conductive layer, conductive layers having the same composition of that of the conductive layers 22a and 22b may be deposited on the conductive layers 22a and 22b, or using a target having a composition different from that of the main conductive layers 22a and 22b on the substrate side, the surface-side main conductive layer 23 may be deposited as shown in FIG. 2.

In the production method of the present invention, the thickness of each of the underlying conductive layer 21 and the main conductive layer 25 can be made to fall within a range as described above by adjusting the number of deposition chambers to be used for formation of the conductive layers, and the applied power in each deposition chamber.

Hereinafter, deposition conditions for each layer, etc. will be described in detail by taking an example in which using a sputtering apparatus including four deposition chambers 201 to 204 as shown in FIG. 3, the underlying conductive layer 21, and the main conductive layer 25 including the substrate-side main conductive layer 22 and the surface-side main conductive layer 23 are subsequently formed as shown in FIG. 2.

In this form, the transparent film substrate 10 unwound from the unwinding roll 271 is subjected to a heat treatment on the heating roll 251 in the heating chamber 209, and then introduced into the first deposition chamber 201 via carrying rolls 264 and 266 which are situated on the downstream side.

(Formation of Underlying Conductive Layer)

In the first deposition chamber 201, the underlying conductive layer 21 is formed. In formation of the underlying conductive layer 21 on the transparent film substrate 10, carbon atom-containing gases such as carbon monoxide, carbon dioxide and hydrocarbons, and nitrogen atom-containing gases such as a nitrogen gas are released from the transparent film substrate 10. These carbon atom-containing gases and nitrogen atom-containing gases are detected as a gas with a mass-to-charge ratio (m/z) of 28 by a mass spectrometer. The carbon atom-containing gases and nitrogen atom-containing gases are released into a deposition atmosphere from the transparent film substrate due to, for example, plasma damage to the film substrate (or the hard coat layer, optical adjustment layer or the like formed on the surface thereof) during sputtering deposition.

In the present invention, the applied power in the deposition chamber 201 where the underlying conductive layer 21 is formed is 5% to 20% of the total applied power in each the deposition chamber 201 to 204 where the underlying conductive layer 21 or the main conductive layer 25 are formed. Since sputtering deposition of the underlying conductive layer is performed with an applied power that is 5% or more of the total applied power, the amount of an outgas released to the deposition chamber 201 from the transparent film substrate 10 can be increased. Specifically, the partial pressure of a gas with a mass-to-charge ratio of 28, which is measured by a quadrupole mass spectrometer in the deposition chamber 201 where the underlying conductive layer 21 is formed can be 70% or more of the total partial pressure of a gas with a mass-to-charge ratio of 28, which is measured by a quadrupole mass spectrometer in the deposition chambers 201 to 204. The partial pressure of a gas with a mass-to-charge ratio of 28 in the deposition chamber 201 is preferably 75% or more, more preferably 80% or more, further preferably 85% or more of the total partial pressure of a gas with a mass-to-charge ratio of 28 in all the deposition chambers 201 to 204. The partial pressure of a gas with a mass-to-charge ratio of 28 can be monitored by an online quadrupole mass spectrometer (Q-mass) provided in each deposition chamber.

As described in Patent Document 3 (JP-A 2010-282785), the crystallization behavior after deposition of the transparent electrode layer is influenced when carbon atom-containing gases and nitrogen atom-containing gases volatilized from the substrate exist in a deposition atmosphere. Accordingly, it is considered that generally the partial pressure of a gas with a mass-to-charge ratio of 28 in a deposition atmosphere is preferably low for forming a transparent electrode layer capable of being crystallized in a short time. In this respect, in the present invention, carbon atom-containing gases and nitrogen atom-containing gases are actively released from the substrate to the deposition chamber 201 during sputtering deposition of the underlying conductive layer 21, and thus the partial pressure of carbon atom-containing gases and nitrogen atom-containing gases (partial pressure of a gas with a mass-to-charge ratio of 28, which is measured by Q-mass) in the deposition chambers 202 to 204 in deposition of the main conductive layer 25 on the underlying conductive layer 21 can be decreased. Accordingly, the main conductive layer 25 constituting the main thickness of the transparent electrode layer 20 can be formed as a conductive film which is capable of being crystallized in a short time and has low resistance.

From studies by the present inventors, it has been found that the partial pressure of a gas with a mass-to-charge ratio of 28 in the deposition chamber does not increase when a bombardment disclosed in Patent Document 3 is performed. The partial pressure of a gas with a mass-to-charge ratio of 28 in the deposition chamber 201 increases only when an underlying conductive layer is deposited using an ITO target (mixed sintered target of indium oxide and tin oxide). This may be because when deposition is performed using an oxide target as in the present invention, a power is applied to the target to generate an oxygen plasma, and the oxygen plasma arriving at the substrate surface has an action of "dispelling" carbon atom-containing gases and nitrogen atom-containing gases from the film substrate into the deposition chamber.

For increasing the partial pressure of carbon atom-containing gases and nitrogen atom-containing gases released into the deposition chamber 201 and decreasing the partial pressure of carbon atom-containing gases and nitrogen atom-containing gases in the subsequent deposition chambers 202 to 204 during formation of the underlying conductive layer 21, the applied power during deposition of the underlying conductive layer 21 is preferably 7% or more, more preferably 8% or more of the total applied power in all the deposition chambers 201 to 204. On the other hand, when the applied power for the underlying conductive layer 21 is excessively large, the thickness ratio of the underlying conductive layer 21 in the transparent electrode layer 20 increases, so that the transparent electrode layer tends to have high resistance, or much time tends to be required for crystallization. Accordingly, the applied power for the underlying conductive layer 21 is preferably 17% or less, more preferably 15% or less of the total applied power in all the deposition chambers 201 to 204. The power density in deposition of the underlying conductive layer 21 is preferably 0.5 $W/cm^2$ to 8 $W/cm^2$, more preferably 0.8 $W/cm^2$ to 7 $W/cm^2$, further preferably 1 $W/cm^2$ to 6 $W/cm^2$.

In deposition of the underlying conductive layer 21, the concentration of carbon atom-containing gases and nitrogen atom-containing gases in the deposition chamber 201 is higher as compared to that during deposition of the main conductive layer, and therefore the underlying conductive layer 21 itself is a layer that is relatively hard to be crystallized. On the other hand, the underlying conductive layer 21 itself constitutes a part of the transparent electrode layer 20, and therefore for reducing the crystallization time of the whole transparent electrode layer 20, it is preferable that ITO having a crystallization-facilitating composition is formed as the underlying conductive layer 21. In general, as the content of tin oxide in ITO decreases, the crystallization time tends to decrease because the amount of carrier impurities that hinder crystallization of indium oxide becomes smaller. Accordingly, the content of tin oxide in the underlying conductive layer 21 is preferably lower than the content of tin oxide in the main conductive layer 25. In the underlying conductive layer 21, the content of tin oxide based on the total of indium oxide and tin oxide is preferably 8% by weight or less, preferably 6% by weight or less, further preferably 4% by weight or less. The underlying conductive layer 21 may be a layer of indium oxide which does not contain tin oxide.

After formation of the underlying conductive layer 21, the substrate-side main conductive layer 22 is sputtering-deposited in the second deposition chamber 202 and the third deposition chamber 203, and the surface-side main conductive layer 23 is sputtering-deposited in the fourth deposition chamber 204 to form the main conductive layer 25. In the production method of the present invention, the underlying conductive layer 21 is formed before deposition of the main conductive layer 25. At this time, a gas in the transparent film substrate is released. Accordingly, the partial pressure of a gas with a mass-to-charge ratio of 28, which is measured by Q-mass in the deposition chambers 202 to 204 during formation of the main conductive layer 25 decreases, so that the main conductive layer 25 capable of being crystallized in a short time is formed.

As compared to the applied power in the deposition chamber 202 where the ITO thin-film 22a that is in contact with the first ITO thin-film, i.e., underlying conductive layer 21 is deposited, the applied power in the deposition chamber 203 where the ITO thin-film 22b is subsequently deposited is made larger in formation of the main conductive layer 25. During formation of the ITO thin-film 22a immediately above the underlying conductive layer 21, a gas in the deposition chamber 201 which is released during formation of the underlying conductive layer 21, and a gas adsorbed to the surface of the underlying conductive layer 21 may be carried in the deposition chamber 202. In the production method of the present invention, the applied power during deposition of the ITO thin-film 22a immediately above the underlying conductive layer 21 can be made relatively small to suppress an influence on crystallization by a gas carried in the deposition chamber 202. The ITO thin-film 22b is deposited with a relatively high power in the deposition chamber 203 adjacent to the deposition chamber 202, so that a high-quality film hardly influenced by carbon atom-containing gases and nitrogen atom-containing gases can be deposited at a high rate.

For improving the productivity of the transparent conductive film, the applied power in the deposition chamber 203 during deposition of the ITO thin-film 22b is preferably 1.1 or more times, more preferably 1.3 or more times, further preferably 1.5 or more times the applied power in the deposition chamber 202 during deposition of the ITO thin-film 22a that is in contact with the underlying conductive layer 21. On the other hand, for suppressing damage to, for example, the ITO thin-film 22a serving as a base during deposition of the ITO thin-film 22b, the applied power during deposition of the ITO thin-film 22b is preferably 5 or less times, more preferably 4 or less times, further preferably 3 or less times the applied power during deposition of the ITO thin-film 22a.

The ratio of the applied power in the deposition chamber 201 during deposition of the underlying conductive layer 21 to the applied power in the deposition chamber 202 during deposition of the ITO thin-film 22a is not particularly limited. For properly maintaining the thickness ratio of the underlying conductive layer to the main conductive layer, the applied power during deposition of the ITO thin-film 22a is preferably larger than the applied power during deposition of the underlying conductive layer 21. The applied power during deposition of the ITO thin-film 22a is more preferably 1.1 to 5 times, further preferably 1.3 to 4 times, especially preferably 1.5 to 3 times the applied power during deposition of the underlying conductive layer 21. The applied power during deposition of the ITO thin-film 22b is preferably 1.5 to 10 times, more preferably 2 to 8 times, further preferably 3 to 6 times the applied power during deposition of the underlying conductive layer 21.

The power density in deposition of the ITO thin-film 22a that is in contact with the underlying conductive layer 21 is preferably 0.8 $W/cm^2$ to 9 $W/cm^2$, more preferably 1.0 $W/cm^2$ to 6 $W/cm^2$, further preferably 1.2 $W/cm^2$ to 5 $W/cm^2$. The power density in deposition of the ITO thin-film 22b on the ITO thin-film 22a is preferably 1.0 $W/cm^2$ to 12 $W/cm^2$, more preferably 1.5 $W/cm^2$ to 9 $W/cm^2$, further preferably 2.0 $W/cm^2$ to 6 $W/cm^2$.

It is preferable to increase the content of tin oxide in the main conductive layer 25 for increasing the carrier density of the transparent electrode layer 20 to reduce resistance. The content of tin oxide based on the total of indium oxide and tin oxide in the main conductive layer 25 is preferably higher than the content of tin oxide based on the total of indium oxide and tin oxide in the underlying conductive layer 21. For reducing the resistance of the transparent electrode layer, the content of tin oxide based on the total of indium oxide and tin oxide in the main conductive layer 25 is preferably 6% by weight or more, more preferably 7% by weight or more, further preferably 8% by weight or more. For reducing the crystallization time of the transparent electrode layer, the content of tin oxide based on the total of indium oxide and tin oxide in the main conductive layer 25 is preferably 15% by weight or less, more preferably 13% by weight or less, further preferably 12% by weight or less. When the main conductive layer 25 includes a plurality of ITO thin-films 22 and 23 having different tin oxide contents as shown in FIG. 2, it is preferable that the average of the contents of tin oxide based on the total of indium oxide and tin oxide in the whole main conductive layer 25 is in a range as described above.

After the substrate-side main conductive layer 22 is formed in the deposition chambers 202 and 203, the surface-side main conductive layer 23 having a composition different from that of the substrate-side main conductive layer may be further formed in the deposition chamber 204. For example, when an ITO thin-film having a lower tin oxide content based on the total of indium oxide and tin oxide as compared to the substrate-side main conductive layer 22 is provided as the surface-side main conductive layer 23 on the substrate-side main conductive layer 22, the crystallization time of the transparent electrode layer can be reduced.

In the surface-side main conductive layer 23, the content of tin oxide based on the total of indium oxide and tin oxide is preferably 8% by weight or less, more preferably 6% by weight or less, further preferably 4% by weight or less. The surface-side main conductive layer 23 may be a layer of indium oxide which does not contain tin oxide.

For reducing the resistance of the transparent electrode layer, the thickness of the surface-side main conductive layer 23 may be, for example, about 1 nm to 12 nm, preferably 2 nm to 8 nm. The thickness of the surface-side main conductive layer 23 is preferably smaller than the thickness of the substrate-side main conductive layer 22 (total thickness of conductive layers 22a and 22b), and more preferably 90% or less, further preferably 80% or less, especially preferably 75% or less of the thickness of the substrate-side main conductive layer 22. Preferably, the applied power (and power density) during deposition of the surface-side main conductive layer 23 is set in such a manner that the thickness is in a range as described above.

[Physical Properties of Transparent Conductive Film]

After the transparent electrode layer is deposited on the substrate on the deposition roll 256, the transparent conductive film is wound around the winding roll 276 to obtain a wound body 250 of the transparent conductive film. The transparent electrode layer 20 sputtering-deposited on the transparent film substrate 10 is an amorphous ITO film immediately after deposition. When the transparent conductive film is heated, ITO is crystallized. In the production method of the present invention, the main conductive layer 25 constituting a main part of the thickness of the transparent electrode layer is formed on the underlying conductive layer 21 having a small thickness, and therefore the amorphous ITO film can be crystallized by short-time heating. For example, crystallization is performed by heating for 30 to 90 minutes in an environment at 120° C. to 150° C. in the presence of oxygen. In the transparent conductive film of the present invention, the surface resistance of the transparent electrode layer after crystallization by heating at 140° C. for 30 minutes is preferably 210 Ω/sq or less, more preferably 180 Ω/sq or less, further preferably 150 Ω/sq or less.

[Uses of Transparent Conductive Film]

The transparent conductive film obtained using the production method of the present invention can be used as a transparent electrode in a display, a light emitting element, a photoelectric conversion element or the like. Particularly, the transparent conductive film is preferably used as a position detecting electrode in a capacitance touch panel because the transparent electrode layer after crystallization has low resistance. When the transparent conductive film is used in a capacitance touch panel, the transparent electrode layer 20 is patterned into an electrode-formed section and an electrode-non-formed section by wet etching.

EXAMPLE

Hereinafter, the present invention will be described more in detail by showing examples. The present invention is not limited to these examples.

[Measurement Method]
(Surface Resistance and Resistivity)

The surface resistance of the transparent electrode layer was determined by four-point probe pressure contact measurement using Low Resistivity Meter Loresta GP (MCP-T710 manufactured by Mitsubishi Chemical Corporation). The surface resistance of the transparent electrode layer after crystallization was measured after a sample which had completed crystallization was taken out from an oven, and cooled to room temperature. The resistivity of the transparent electrode layer was calculated from a product of the value of the surface resistance and the thickness.

Example 1

In Example 1, a transparent electrode layer including an underlying conductive layer, a substrate-side main conductive layer and a surface-side main conductive layer was deposited on a transparent film substrate by using a roll-to-roll sputtering apparatus to prepare a transparent conductive film.

As the transparent film base, a 50 μm-thick PET film, both surfaces thereof were each provided with a hard coat layer formed of a urethane-based resin, was used. A transparent film base wound body was introduced into a roll to roll sputtering apparatus. The temperatures of a heating roll and a deposition roll were controlled to 100° C. and 40° C., respectively, the inside of a heating chamber and the inside of a deposition chamber were each decompressed to $1\times10^{-3}$ Pa or less, and pre-sputtering was performed for 14 minutes. Thereafter, argon and oxygen were supplied to each deposition chamber to control the pressure to 0.2 Pa. The oxygen supply amount in a deposition chamber 201 for formation of the underlying conductive layer was 4.0 sccm, and the oxygen supply amount in each of deposition chambers 202, 203 and 204 for formation of the main conductive layer was 1.3 sccm.

The film substrate was conveyed at 7.7 m/minute from the unwinding roll 271 side to the winding roll 276 side, the film was heated with a heating roll 251, and a transparent electrode layer was deposited on a deposition roll 256 under the following conditions. In the first deposition chamber 201, an ITO target having a tin oxide content of 3% was placed, and a power was applied with a power density of 1.4 W/cm² to deposit an underlying conductive layer 21. In the second deposition chamber 202, an ITO target having a tin oxide content of 10% was placed, and a power was applied with a power density of 3.0 W/cm² to deposit a substrate-side main conductive layer 22a. In the third deposition chamber 203, an ITO target having a tin oxide content of 10% was placed, and a power was applied with a power density of 5.6 W/cm² to deposit a substrate-side main conductive layer 22b. In the fourth deposition chamber 204, an ITO target having a tin oxide content of 3% was placed, and a power was applied with a power density of 5.6 W/cm² to deposit a surface-side main conductive layer 23. The targets used for deposition of the layers had the same area, and the applied power in the deposition chamber where the underlying conductive layer was formed was 9.0% of the applied power in all the deposition chambers.

The thickness in deposition of a monolayer film under the same conditions as those for the above-mentioned layers was 2 nm for the underlying conductive layer 21, 4 nm and 8 nm for the substrate-side main conductive layers 22a and 22b, respectively, and 8 nm for the surface-side conductive layer 23.

Example 2

In Example 2, a transparent conductive film was prepared in the same manner as in Example 1 except that the applied power density during deposition of the underlying conductive layer was changed to 1.0 W/cm² (rate to the total power was 6.6%). The thickness of the underlying conductive layer 21 was 1.5 nm.

Comparative Example 1

In Comparative Example 1, a transparent conductive film was prepared in the same manner as in Example 1 except that the applied power density during deposition of the underlying conductive layer was changed to 0.5 W/cm² (rate to the total power was 3.4%). The thickness of the underlying conductive layer 21 was 1 nm.

The conditions for production of the transparent conductive film (the power density and the partial pressure of a gas with m/z 28 in the deposition chambers), and the surface resistance, the resistivity and the transmittance after crystallization of the transparent conductive film by heating at 140° C. for 30 minutes in the Examples and Comparative Example are shown in Table 1. The graphed relationships between the ratio of the power in the first deposition chamber (deposition chamber for the underlying conductive layer 21) to the total power in all the deposition chambers and the partial pressure of a gas with m/z 28, which is measured by online Q-mass in the deposition chambers in the Examples and Comparative Example are shown in FIG. 4.

TABLE 1

| | Power density (W/cm²) | | | | Partial pressure of gas with m/z 28 ($\times 10^{-4}$ Pa) | | | | | Properties after heating at 140° C. for 30 minutes | | |
|---|---|---|---|---|---|---|---|---|---|---|---|---|
| | Underlying conductive | Main conductive layer | | | First | Underlying conductive | Main conductive layer | | | First | Surface Resistance | Resistivity | Trans-mittance |
| Conductive layer Deposition chamber | layer 21 1 | 22a 2 | 22b 3 | 23 4 | deposition chamber/ total | layer 21 1 | 22a 2 | 22b 3 | 23 4 | deposition chamber/ total | (Ω/sq) | ($\times 10^{-4}$ Ωcm) | (%) |
| Example 1 | 1.4 | 3.0 | 5.6 | 5.6 | 9.0% | 36.5 | 1.9 | 1.7 | 2.1 | 86.5% | 136 | 2.7 | 90.0 |
| Example 2 | 1.0 | 3.0 | 5.6 | 5.6 | 6.6% | 33.8 | 4.1 | 1.7 | 2.2 | 80.9% | 145 | 2.9 | 90.0 |
| Comparative Example 1 | 0.5 | 3.0 | 5.6 | 5.6 | 3.4% | 24.1 | 10.0 | 2.0 | 2.8 | 62.0% | 275 | 5.5 | 88.1 |

Figure 4:
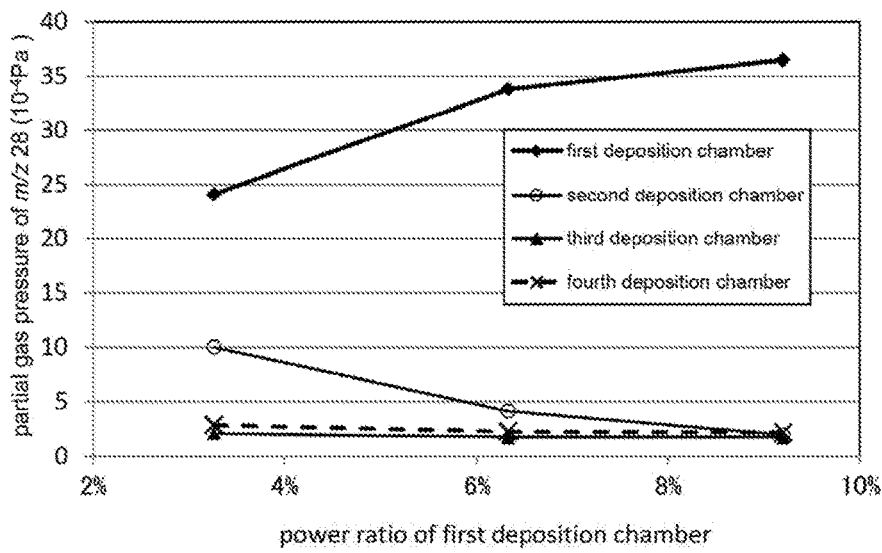
FIG. 4 is a graph showing a gas concentration in each deposition chamber in Examples and Comparative Examples.

FIG. 4 shows that when the applied power during deposition of the underlying conductive layer is increased, the partial pressure of a gas with m/z 28 in the first deposition chamber increases, and accordingly, the partial pressure of a gas with m/z 28 in the main conductive layer deposition environments (second, third and fourth deposition chambers) decreases. It is apparent that carbon atom-containing gases and nitrogen atom-containing gases in the substrate are released during deposition of the underlying conductive layer, so that the amount of released carbon atom-containing gases and nitrogen atom-containing gases during deposition of the main conductive layer decreases.

In Example 1 and Example 2, the resistivity after heating at 140° C. for 30 minutes is lower than $3 \times 10^{-4}$ Ωcm, and the transmittance is 90%. On the other hand, in Comparative Example 1, the resistivity is high and the transmittance is low as compared to Examples 1 and 2. This may be because in Comparative Example 1, crystallization did not sufficiently proceed in heating at 140° C. for 30 minutes. As a cause of this, it is considered that since the applied power during deposition of the underlying conductive layer was small, gases in the substrate were not sufficiently released, so that the amount of released gases during deposition of the main conductive layer increased, leading to an increase in time required for crystallization.

From the above results, it is apparent that by releasing gases in the transparent film substrate with the applied power kept in a predetermined range during deposition of the underlying conductive layer, the concentration of carbon atom-containing gases and nitrogen atom-containing gases in a main conductive layer deposition atmosphere can be decreased, and accordingly, a transparent conductive film capable of being crystallized by heating in a short time can be obtained.

DESCRIPTION OF REFERENCE CHARACTERS

101, 102 transparent conductive film
10 transparent film substrate
20 transparent electrode layer
21 underlying conductive layer
25 main conductive layer
22 substrate-side main conductive layer
23 surface-side main conductive layer
200 sputtering apparatus
271 unwinding roll
276 winding roll
209 heating chamber
251 heating roll
256 deposition roll
201-204 deposition chamber
221-224 target
281-284 cathode

The invention claimed is:

1. A method for producing a transparent conductive film using a roll to roll sputtering apparatus, the transparent conductive film including a transparent film base and a transparent electrode layer on the transparent film base, wherein
the roll to roll sputtering apparatus includes at least a first deposition chamber, a second deposition chamber, and a third deposition chamber adjacent to a deposition roll,
a transparent film base is unwound from a transparent film base wound body and conveyed over the deposition roll in the roll to roll sputtering apparatus, and the following steps are performed therewhile:
an underlying conductive layer formation step of forming an underlying conductive layer formed of an ITO thin-film and having a thickness of 0.5 nm to 4 nm by sputtering deposition in at least the first deposition chamber; and
a main conductive layer formation step of forming on the underlying conductive layer a main conductive layer formed of an ITO thin-film having a total thickness of 8 nm to 25 nm by sequential sputtering deposition in at least the second deposition chamber and the third deposition chamber, wherein
an applied power in the first deposition chamber where the underlying conductive layer is formed is 5% to 20% of a combined total applied power of the deposition chambers where the underlying conductive layer or the main conductive layer are formed,
in the main conductive layer formation step, an applied power in the second deposition chamber where the ITO thin-film is first deposited is less than an applied power in the third deposition chamber where the ITO thin-film is next deposited,
a partial pressure of a gas with a mass-to-charge ratio of 28, which is measured by a quadrupole mass spectrometer, in the deposition chamber where the underlying conductive layer is formed is 75% or more of a combined total partial pressures of a gas with a mass-to-charge ratio of 28, which is measured by a quadrupole mass spectrometer, of the deposition chambers where the underlying conductive layer or the main conductive layer is formed.

2. The method for producing a transparent conductive film according to claim 1, wherein a content of tin oxide based on the total of indium oxide and tin oxide in the underlying conductive layer is 8% by weight or less.

3. The method for producing a transparent conductive film according to claim 1, wherein
the main conductive layer includes a substrate-side main conductive layer, and a surface-side main conductive layer having a lower tin oxide content based on the total of indium oxide and tin oxide as compared to the substrate-side main conductive layer, and
in the main conductive layer formation step, the substrate-side main conductive layer is sputtering deposited in two or more deposition chambers, and then the surface-side main conductive layer is sputtering deposited thereon.

4. The method for producing a transparent conductive film according to claim 1, wherein
a content of tin oxide based on the total of indium oxide and tin oxide in the main conductive layer is 6% by weight to 15% by weight, and
the content of tin oxide based on the total of indium oxide and tin oxide in the main conductive layer is higher than the content of tin oxide based on the total of indium oxide and tin oxide in the underlying conductive layer.

5. The method for producing a transparent conductive film according to claim 1, wherein the transparent film base that is unwound from the wound body is subjected to a heat treatment before being conveyed onto the deposition roll.

6. The method for producing a transparent conductive film according to claim 5, wherein the heat treatment is performed by bringing the transparent film base into contact with a heating roll.

* * * * *